United States Patent [19]
Sculley

[11] Patent Number: 6,084,439
[45] Date of Patent: Jul. 4, 2000

[54] PEAK DETECTOR CIRCUIT WITH EXTENDED INPUT VOLTAGE RANGE

[75] Inventor: Sua-Ki Stephanie Sculley, Austin, Tex.

[73] Assignee: Cypress Semiconductor Corp., San Jose, Calif.

[21] Appl. No.: 08/886,913

[22] Filed: Jul. 2, 1997

[51] Int. Cl.[7] ......................... G01R 19/04; H03K 5/1532
[52] U.S. Cl. ................................ 327/59; 327/63; 327/73
[58] Field of Search ................................ 327/62, 61, 60, 327/59, 58, 72, 73, 309, 63

[56] References Cited

U.S. PATENT DOCUMENTS

| 4,163,909 | 8/1979 | Harr | 327/59 |
| 4,185,211 | 1/1980 | Kucharewski | 327/58 |
| 4,393,353 | 7/1983 | Minagawa | 330/102 |
| 4,574,202 | 3/1986 | Ogawa | 327/58 |

(List continued on next page.)

FOREIGN PATENT DOCUMENTS

| 0 438 706 | 7/1991 | European Pat. Off. | ... H03K 19/0185 |
| 0 440 192 | 8/1991 | European Pat. Off. | ..... H03K 19/086 |

OTHER PUBLICATIONS

Kuratli et al., "Implementation of High Peak–Current IBGT Gate Drive Circuits in VLSI Compatible BiCMOS Technology," IEEE Journal of Solid–State Circuits, vol. 31, No. 9, Jul. 1996, pp. 924–932.

Kosyuk, V.I., "A Peak Detector With Input–Signal Negative Feedback," 1991 Scripta Technica, Inc., pp. 139–141.

Chen, Kuan–Dar, et al., "A Novel Offset Current Cancellation Technique for Switched–Current Circuits and Systems," 1996 IEEE, pp. 417–420.

Agakhanyan, T.M., "High–Speed and Wide–Band Analog Integrated Circuits," 1986 Plenum Publishing Corporation, pp. 71–74.

Venable, H. Dean, "Testing Power Factor Correction Circuits for Stability," Power Quality, Oct. 1993 Proceedings, pp. 225–235.

Koli et al., "Temperature Compensated Logarithmic Peak Detector," Analog Integrated Circuits and Signal Processing, 9, 1996, pp. 131–140.

(List continued on next page.)

Primary Examiner—Timothy P. Callahan
Assistant Examiner—Terry L. Englund
Attorney, Agent, or Firm—Kevin L. Daffer; Conley, Rose & Tayon

[57] ABSTRACT

A detector circuit may detect a peak value of at least one input voltage and may provide the peak value as an output for use by other circuitry capable of being coupled to the detector circuit. Pairs of differential inputs may be employed, using n-channel transistors (in one example), and using diodes to capture the peak at a shared output node. Each differential pair has two constant current devices connecting the source/drain paths to the terminal of a voltage supply. This circuit enables the use of high input voltages which may be at or near the upper power supply (e.g., $V_{DD}$). The circuit is in effect a negative peak detector, capturing the most negative value of at least one input level and holding that level, with a slow leakage of the held value back toward the upper voltage supply with a time constant that is generally set much slower than the input signal transition frequency. A similar circuit may be implemented using p-channel transistors in the differential pairs, to detect positive peaks. A portion of the detector circuit can be used as a single-input peak detector. Also, the partial detector circuit can be used as modules having a common output node in a multiple-input detector circuit.

18 Claims, 4 Drawing Sheets

U.S. PATENT DOCUMENTS

| | | | |
|---|---|---|---|
| 4,603,299 | 7/1986 | Monett | 327/59 |
| 4,720,643 | 1/1988 | Embree et al. | 327/58 |
| 4,789,798 | 12/1988 | Lach | 326/69 |
| 4,947,061 | 8/1990 | Metz et al. | 326/73 |
| 4,980,579 | 12/1990 | McDonald et al. | |
| 4,996,448 | 2/1991 | Abdi | 327/59 |
| 4,998,028 | 3/1991 | Chappell et al. | 326/73 |
| 5,038,055 | 8/1991 | Kinoshita | 327/58 |
| 5,089,721 | 2/1992 | Luich | 326/26 |
| 5,089,723 | 2/1992 | Davis et al. | 326/84 |
| 5,122,683 | 6/1992 | Sugoh et al. | 326/126 |
| 5,280,204 | 1/1994 | Livolsi | 326/62 |
| 5,304,939 | 4/1994 | Davies | 327/60 |
| 5,307,196 | 4/1994 | Kinoshita | 327/63 |
| 5,324,994 | 6/1994 | Sullivan et al. | 327/58 |
| 5,331,210 | 7/1994 | McCarroll | 327/58 |
| 5,343,092 | 8/1994 | Dhong et al. | 326/126 |
| 5,362,992 | 11/1994 | Wile | 327/58 |
| 5,365,279 | 11/1994 | Harford | 348/678 |
| 5,376,836 | 12/1994 | Tago | 327/215 |
| 5,381,052 | 1/1995 | Kolte | 327/58 |
| 5,404,053 | 4/1995 | Poma et al. | 327/108 |
| 5,424,658 | 6/1995 | Sikkink et al. | 326/77 |
| 5,465,057 | 11/1995 | Takahashi | 326/66 |
| 5,495,184 | 2/1996 | Des Rosiers et al. | 326/73 |
| 5,514,988 | 5/1996 | Schrader et al. | 327/102 |
| 5,535,160 | 7/1996 | Yamaguchi | 365/189.01 |
| 5,543,668 | 8/1996 | Fong | 307/110 |
| 5,546,027 | 8/1996 | Shinozaki et al. | 327/59 |
| 5,574,634 | 11/1996 | Parlour et al. | 363/59 |
| 5,578,964 | 11/1996 | Kim et al. | 330/253 |
| 5,606,270 | 2/1997 | D'Souza et al. | 326/98 |
| 5,614,843 | 3/1997 | Mita et al. | 326/73 |
| 5,631,584 | 5/1997 | Smith | 327/62 |
| 5,757,209 | 5/1998 | Van Zalinge et al. | 327/58 |
| 5,828,240 | 10/1998 | Smith | 327/58 |
| 5,847,576 | 12/1998 | Mastrocola et al. | 326/31 |
| 5,880,615 | 3/1999 | Bazes | 327/307 |

OTHER PUBLICATIONS

Sidiropoulos et al., "A Speed, Power, and Supply Noise Evaluation of ECL Driver Circuits," 1994 Bipolar/BiCMOS Circuits & Technology Meeting, pp. 119–122.

Taniguchi et al., "Current Sources for Emitter–Coupled Logic Circuits and Their Application to Subnanosecond Logic Integrated Circuits," Electronics and Communicatins in Japan, vol. 60–C, No. 12, 1977, pp. 118–127.

Ueda et al., "A Fully Compensated Active Pull–Down ECL Circuit with Self–Adjusting Driving Capability," IEEE Journal of Solid–State Circuits, vol. 31, No. 1, Jan. 1996, pp. 46–53.

Zargari et al., "A BiCMOS Active Pull–Down ECL Output Driver for Low Power Applications," 1995 IEEE, pp. 50–51.

Truong et al., "A 531 Mb/s Fibre Channel SIPO/PISO Chip Set Capable of Driving 50 m of Shielded Twisted Pair," 1993 IEEE, pp. 370–373.

PEAK DETECTOR CIRCUIT WITH EXTENDED INPUT VOLTAGE RANGE

BACKGROUND OF THE INVENTION

1. Field of the Invention

This invention relates to peak detector circuits and, more particularly, to a peak detector which can detect high and low level voltages near the upper power supply (e.g., $V_{DD}$) or the lower power supply (e.g., ground).

2. Description of the Related Art

In almost all digital systems, a distinction is made between a logic high level and a logic low level. In metal oxide semiconductor (MOS) technologies, a high logic level is substantially near an upper power supply while the logic low level is substantially near a lower power supply. However, in emitter coupled logic (ECL) the high and low logic levels are within a range fairly close to one another generally near the upper power supply.

To discern logic high and low levels, it may be advantageous to implement a peak detector. The peak detector determines if an input voltage applied to the detector is either at a high voltage level or a low voltage level. For ECL voltage levels, the peak detector must be quite sensitive to slight variations in the input voltage or voltages and must discern those variations at or near either the upper or the lower power supplies. Peak detectors may also be used in analog circuitry. It is oftentimes desirable to determine the global minimum of two or more sinusoidally varying input voltages and provide that minimum as an output to other circuitry. Accordingly, the peak detector operates to detect information within either an analog or a digital input signal.

Figure 1:
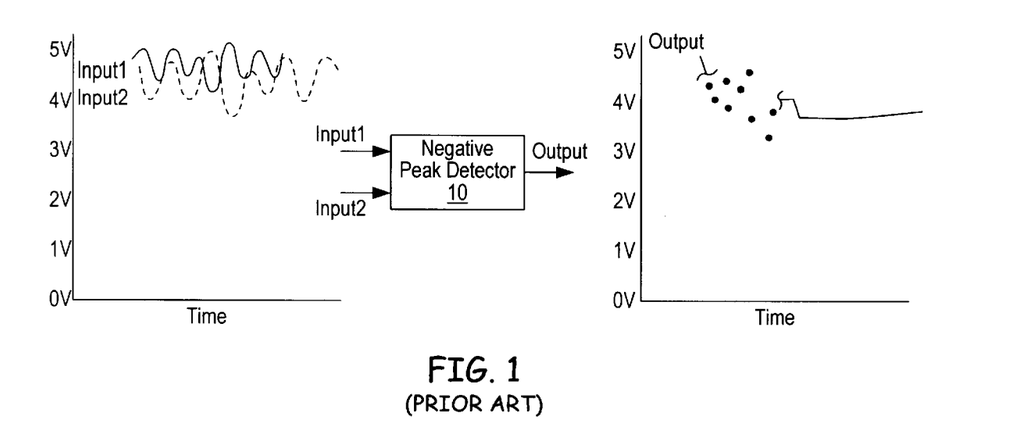
FIG. 1 is a timing diagram of voltage as a function of time for various input signals having variable voltage levels and whose maximum negative voltage level among the input signals is forwarded to an output signal except at voltage levels near the upper power supply.

FIG. 1 illustrates one example of a negative peak detector 10 configured to receive a pair of input signals, labeled as input1 and input2. Peak detector 10 is shown for illustrative purposes as a negative peak detector. Peak detector 10 compares the two input signals, and the smallest magnitude input signal is tracked and thereafter passed to the output signal. If either input1 or input2 decreases, that decrease is recorded as a decrease in the output, as shown in the input and output graphs provided. However, at input voltage levels near the upper power supply, the output cannot properly track for reasons better illustrated in FIG. 2.

Figure 2:
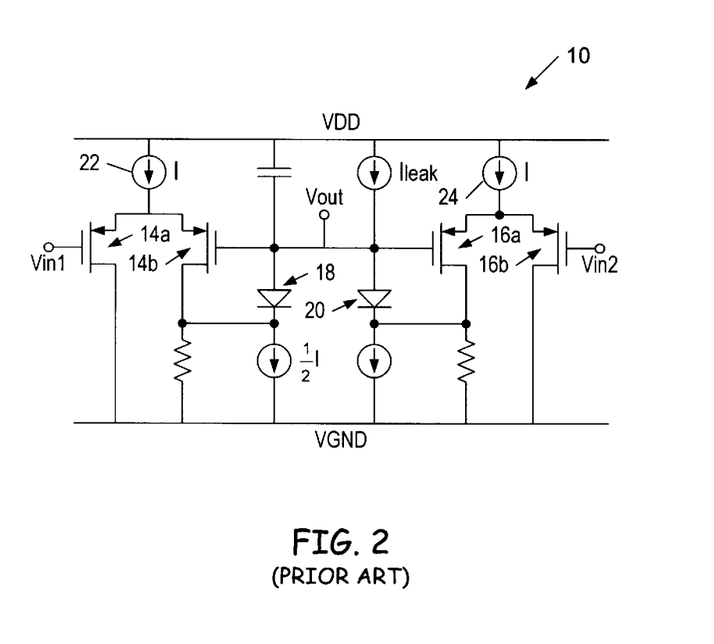
FIG. 2 is a schematic diagram of a conventional peak detector configured to detect negative peak values within input signals and place the maximum negative peak voltage value upon an output signal.

FIG. 2 illustrates one example of how a conventional negative peak detector might be implemented. A typical negative peak detector 10 is shown having at least two differential p-channel pairs of transistors 14 and 16. Transistor pairs 14 and 16 are arranged in a folded layout, with an output node Vout coupled in feedback with the inputs and outputs of transistors 14b and 16a of the transistor pairs 14 and 16. A pair of diodes 18 and 20, coupled within the feedback loop, capture the lowest (or negative) peak voltage applied to the input signal Vin1 or Vin2.

As illustrated in FIG. 2, when the input voltages Vin1 and Vin2 are higher than the output voltage Vout, diodes 18 and 20 are reverse biased and remain in their "off" state. The output voltage therefore remains approximately constant or, as will be described herein, will slowly leak upward to the upper power supply (e.g., $V_{DD}$). The differential pairs of transistors 14 and 16, however, have a disadvantage in that they may not properly function if the input voltages approach the upper power supply. Transistors 14a and 16b, and their associated tail currents (i.e., current sources), operate most effectively when the maximum input voltages applied to their gate conductors are limited to the power supply voltage minus (i) the source-to-drain saturation voltage of the current sources 22 and 24, and minus (ii) the source-to-gate threshold voltages of the transistors 14a and 16b. Current sources 22 and 24 can be effectuated by a single transistor connected to receive a constant DC bias voltage, or a cascoded pair of transistors each of which is coupled to receive a DC bias voltage. In either instance, a voltage difference exists across current sources 22 and 24. If Vin1 and Vin2 exceed this maximum, current sources 22 and 24 may not fully conduct into the saturation region. Using typical values of between 200 to 300 mV for the source-to-drain saturation voltage and 800 to 1200 mV for the source-to-gate operating voltage results in a maximum input voltage of $V_{DD}$–1.0 volt to $V_{DD}$–1.8 volts. In the latter instance, the current source is produced by a cascoded pair of transistors, each having approximately 300 mV source-to-drain drop.

If the high and low voltage ECL levels are in a range which exceed the maximum input voltage, then those levels cannot be discerned. This would possibly be the case if the low voltage level (i.e., Vol) is greater than $V_{DD}$–1.8 volts in the example provided herein above. It would therefore be desirable to derive a negative peak detector which can track input voltages which are at or substantially near the upper power supply in instances when the input voltages to be detected are in a range close to that supply. Conversely, it may also be desirable to derive a positive peak detector which can track input voltages at or substantially near the lower power supply. A positive peak detector can advantageously be used to determine high and low voltage levels if the range of those levels are chosen near ground.

SUMMARY OF THE INVENTION

The problems outlined above are in large part solved by an improved peak detector hereof. The present peak detector can be configured either as a negative peak detector or a positive peak detector.

According to one embodiment, the negative peak detector compares a pair of input voltages, and selects the most negative of those input voltages for placement upon an output node. In order to reduce the output voltage produced from an output node of the detector, either one or both of the pair of input voltages must extend below the output voltage. Thus, the output voltage tracks the lowest voltage within the pair of input voltages to a "negative peak". The negative peak detector advantageously tracks the input voltages from a value approximately at the upper power supply.

According to an alternative embodiment, a positive peak detector is presented. Positive peak detector is realized by inverting various components of the negative peak detector.

Both the negative and positive peak detectors may include two pairs of differential-connected transistors, according to one embodiment. A gate conductor of one transistor within each pair of transistors is coupled to receive an input signal. The gate conductor of the other transistor within each pair is mutually connected to an output signal. The node which delivers the output signal to the gate conductor is fed back to the source-drain path of the transistor attributed to that gate. The feedback characteristics (i.e., voltage and current), are controlled by a bias applied across a diode within the feedback path. The bias amount is controlled by current regulated through a resistor.

According to one embodiment, the peak detector circuit employs comparators (e.g., one or more differentially-connected transistor pairs of n- or p-channel transistors) and a means for capturing the peak (negative or positive peak) at the output node shared, for example, by terminals of one or more diodes. Each comparator may have a constant current source coupled between the lower power supply and mutually connected source-drain paths of the n-channel transistors. If each comparator employs n-channel transistors used in conjunction with a current source arranged between the lower power supply and the n-channel transistors, a negative peak detector can be realized. Negative peak detection occurs at high input voltages at or substantially at the upper power supply voltage level. The circuit, when operating as a negative peak detector, is configured to capture the most negative value of two or more inputs and hold that value on the output node. The circuit may be further configured to slowly leak the held value back toward the upper power supply with a time constant that is generally set to be slower than the input frequencies.

Converse to a negative peak detector, the present circuit may be implemented as a positive peak detector (e.g., using p-channel transistors in the comparators instead of n-channel transistors). Current sources of the negative peak detector are arranged between the upper power supply and mutually connected source-drain paths of the p-channel transistors.

The circuit may be a single-input, dual-input or multiple input positive or negative peak detector. Three or more of the circuits may be implemented as modules having a common output node in the multiple-input circuit embodiment.

BRIEF DESCRIPTION OF THE DRAWINGS

Other objects and advantages of the invention will become apparent upon reading the following detailed description and upon reference to the accompanying drawings in which.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
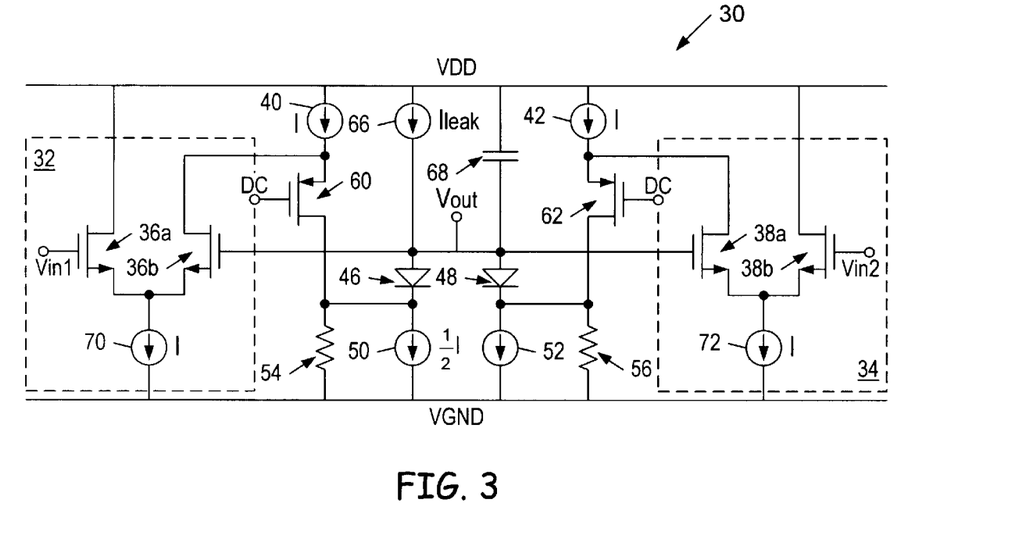
FIG. 3 is a schematic diagram of a peak detector circuit for determining negative peak values according to one embodiment of the present invention employing n-channel transistor differential pairs.

Referring to FIG. 3, a circuit 30 for detecting the global minimum of two input voltages Vin1 and Vin2 is illustrated, according to one embodiment of the invention. A two-input negative peak detector 30 may comprise first and second comparators 32 and 34 (e.g., comprising two differentially-connected pairs of n-channel transistors 36 and 38). A first input voltage (e.g., Vin1) may be connected to the gate of transistor 36a while a second input voltage (e.g., Vin2) may be connected to the gate of transistor 38b. The source-to-drain path of one or more transistors in the comparator (e.g., each transistor of a differential pair) may be coupled between an upper power supply (e.g., $V_{DD}$) and a lower power supply (e.g., ground). Transistors 36b and 38a may be connected to the upper power supply through a respective pair of constant current devices 40 and 42.

An output node may be configured to receive an output signal (e.g., Vout). That node may also provide feedback information concerning the output voltage level to comparators 32 and 34. For example, the output node is connected to the gates of two transistors, 36b and 38a of the first and second comparator differential pairs. The output node may also be connected to the lower power supply via first and second diodes 46 and 48 and through constant current devices 50 and 52. Load devices 54 and 56 may be placed in parallel with current devices 50 and 52, respectively. Transistors 60 and 62 may respectively connect current sources 40 and 42 to the load devices in response to a relatively constant reference signal (e.g., DC bias) of magnitude less than $V_{DD}$. The reference signal voltage magnitude is chosen so that transistors 60 and 62 are always in a low resistance, or "on" state.

A small leakage current may be provided by a constant current leakage device 66 to cause the voltage of the output node to slowly leak upward subsequent to peak detection. The rate of leakage determines how long negative peak voltages are maintained at Vout, even if the Vin1 and/or Vin2 has returned a high level. A capacitor 68 smoothes the output level, reduces and/or eliminates transient responses and, in conjunction with leakage current 66, sets the speed at which the voltage at the output node leaks upward subsequent to negative peak detection.

A "constant current device" may comprise a transistor configured to provide a pre-determined voltage differential and/or current across its source-to-drain path. This may be accomplished by configuring the transistor gate length and/or width size to provide the desired electrical properties, preferably relative to one or more other constant current devices. A reference current device may be scaled down in size by a factor of N relative to the comparator constant current devices; preferably N is greater than 1.0, more preferably N is about 2.0. such a transistor may be n-channel (in which case the gate receives a high operating voltage, such as $V_{DD}$) or p-channel (in which case the gate may be coupled to an appropriate reference voltage, such as ground).

Generally, whenever an input voltage Vin1 or Vin2 drops below the output voltage Vout in the present negative peak detector, then the corresponding peak-capturing device (e.g., at least one of the diodes) will conduct, causing Vout to drop until it is approximately equal to the lowest input voltage, effectively capturing the negative peak voltage of those inputs. When Vin1 and Vin2 are higher than Vout, diodes 46 and 48 remain in an off state, and Vout stays approximately constant. The results of this operation is indicated by the Vout voltage values following the lowest peak (i.e., negative peak) values of the input signals Vin1 or Vin2 for a predetermined period of time typically controlled, in part, by current leakage device 66.

An important feature of the circuit of FIG. 3 is its ability to function properly at input voltages up to the upper power supply voltage $V_{DD}$. For example, when Vin drops below the voltage Vout, then the current through the n-channel transistor 36b increases above I/2. This current is subtracted from the I current source 40 leaving less than I/2 to flow down into load device 54 (shown here as a resistor but which may also comprise an appropriately configured transistor, RC circuit, busline or Ohmic contact). Because the current flowing is less than the I/2 current source 50, the voltage at the n-side of diode 46 drops a threshold amount below Vout at the p-side, turning on diode 46 and causing Vout to drop in voltage until Vout is approximately equal to Vin1. The on resistance of transistors 60, the resistance value of load 54 and the forward bias voltage drop of diode 46, in part, control the "closeness" at which Vout tracks Vin1. When Vout and Vin1 become equal, then the differential transistor pair 36a and 36b is again balanced, with I/2 flowing through each transistor 36a and 36b. As current through transistor 36b decreases to approximately I/2, current through resistor 54 increases, and the voltage at the n-side of diode 46 also increases. Accordingly, equal current through the differential pair causes diode 46 to turn off.

Operation for the other differential comparator 34 is similar to that shown and described relative to comparator 32. Specifically, if Vin2 drops below Vout, diode 48 will forward bias and the output node voltage will decrease to substantially match Vin2.

The leakage current arising from source 66 through load device 54 or 56 will cause the output node to slowly rise toward the upper supply $V_{DD}$ if no negative peaks are detected. Thus, the detectable input voltage range of circuit 30 has been shifted such that the minimum detectable input voltage may be defined as (i) the lower power supply voltage (e.g., ground) plus (ii) the minimum source-to-drain saturation voltage associated with constant current sources 70 or 72 plus (iii) the gate-to-source voltage of transistors 36a or 36b. Using values typical of MOS, CMOS, or BiCMOS technology, for example, a minimum comparator input voltage Vin1 or Vin2 is, for example, ground plus approximately one volt. However, a maximum input voltage which can be detected extends to the upper power supply voltage (e.g., $V_{DD}$). Negative peak detector 30 is particularly directed to applications where the input voltages are within a close range near the upper power supply and somewhat distal from the lower power supply. If the input voltages are closer to the lower power supply, then a positive peak detector would be desirable in lieu of negative peak detector 30.

Figure 4:
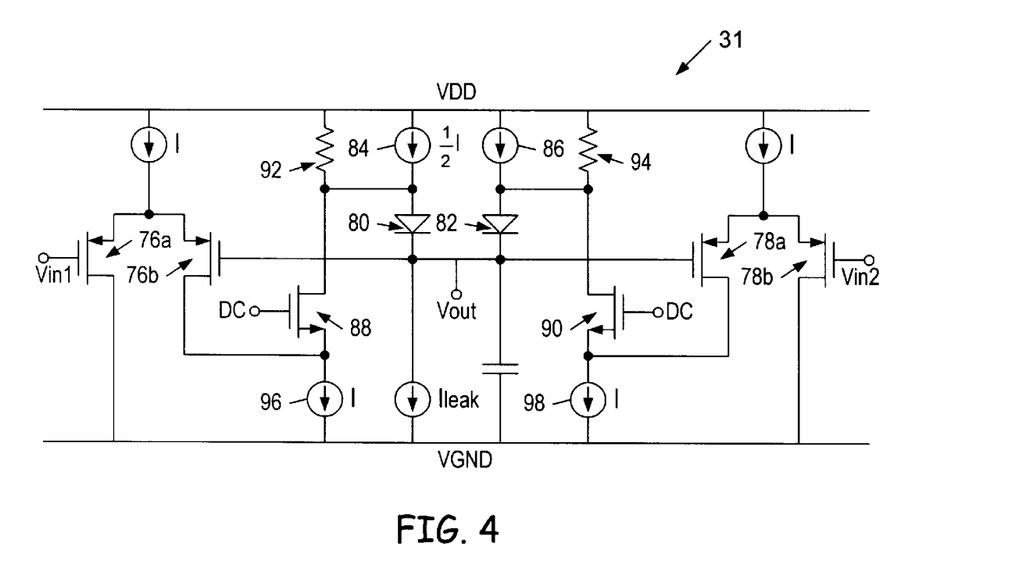
FIG. 4 is a schematic diagram of a peak detector circuit for determining positive peak values using some features of FIG. 3 reconfigured according to another embodiment of the invention employing p-channel transistor differential pairs.

In another embodiment, the circuit of FIG. 3 may be inverted, as seen in FIG. 4. Transistors 76 and 78 may be configured as p-channel transistors instead of n-channel transistors 36 and 38 shown in FIG. 3. Diodes 80 and 82 may be connected between the output node and, through current sources 84 and 86, respectively, to the upper power supply $V_{DD}$. Transistors 88 and 90 are connected between respective load devices 92 and 94 and respective current sources 96 and 98. The circuit shown in FIG. 4 is labeled as reference numeral 31 which functions as a positive peak detector and has an input range extending from a voltage level below the upper power supply voltage to a voltage level at approximately the lower power supply voltage. The upper extent of the detectable input voltage range for the positive peak detector may be approximately the same as the lower extent of the detectable input voltage range established for a negative peak detector. However, the lower extent of the detectable input voltage range for a positive peak detector extends to the lower power supply, while the upper extent of the detectable input voltage range for a negative peak detector extends to the upper power supply. Depending on where the input voltage range exists, a negative peak detector or a positive peak detector can be chosen to optimally detect that range.

Figure 5:
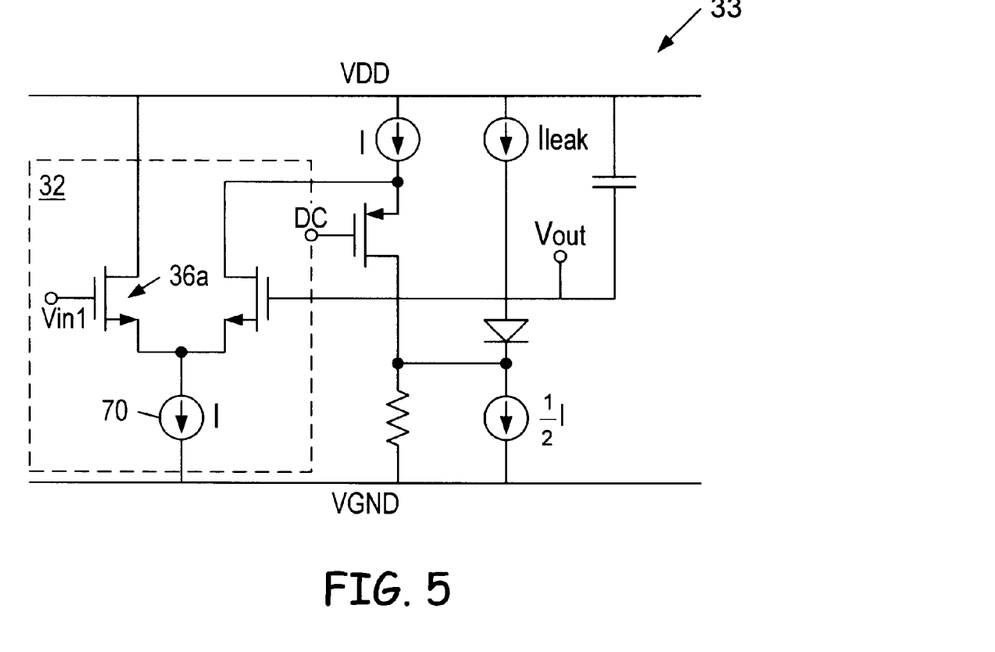
FIG. 5 is schematic diagram of a peak detector circuit using features of FIG. 3 for determining negative peak values according to one input embodiment of the invention.

An additional one-input embodiment of the invention is shown in FIG. 5, which uses only a portion of the circuit of FIG. 3. The single input embodiment in FIG. 5 is illustrated as reference numeral 33, and functions as a negative peak detector, with an operable input range still reaching the upper supply voltage. That is, the output signal will track the input signal with respect to a decrease in that input signal from a voltage value at the upper supply level to a voltage value approximately equal to the source-to-drain voltage drop of current source 70 and the gate-to-source (threshold) drop of transistor 36a of comparator 32. The remaining components of FIG. 5 are similar to that shown in FIG. 3 so that the output signal Vout will follow the negative peaks of only one input signal Vin1.

Figure 6:
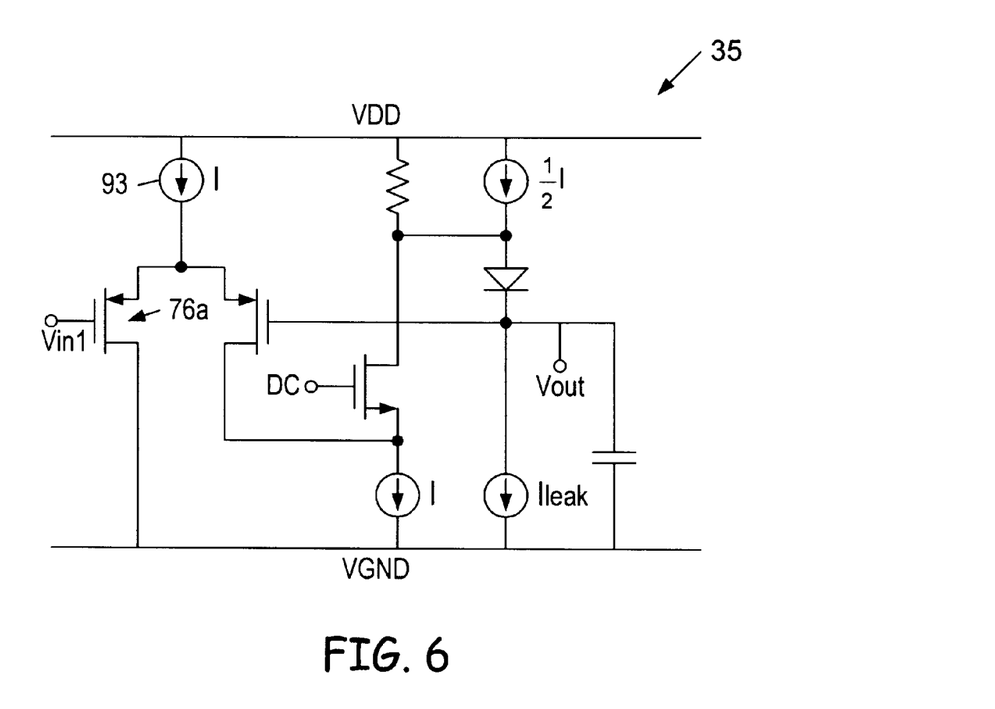
FIG. 6 is a schematic diagram of a peak detector circuit using features of FIG. 4 for determining positive peak values according to one input embodiment of the invention.

Referring to FIG. 6, the circuit of FIG. 5 may be inverted (e.g., using a p-channel differential pair instead of an n-channel differential pair). Circuit 35 of FIG. 6 functions as a positive peak detector with only one input. The input can range from the lower power supply voltage to a level below the upper power supply voltage. The gate-to-source (threshold) voltage drop of transistor 76a, and the source-to-drain voltage drop of current source 93 define the upper extent of that input range. The other components of FIG. 6 are similar to that shown in FIG. 4 to track negative peaks of only one input.

Figure 7:
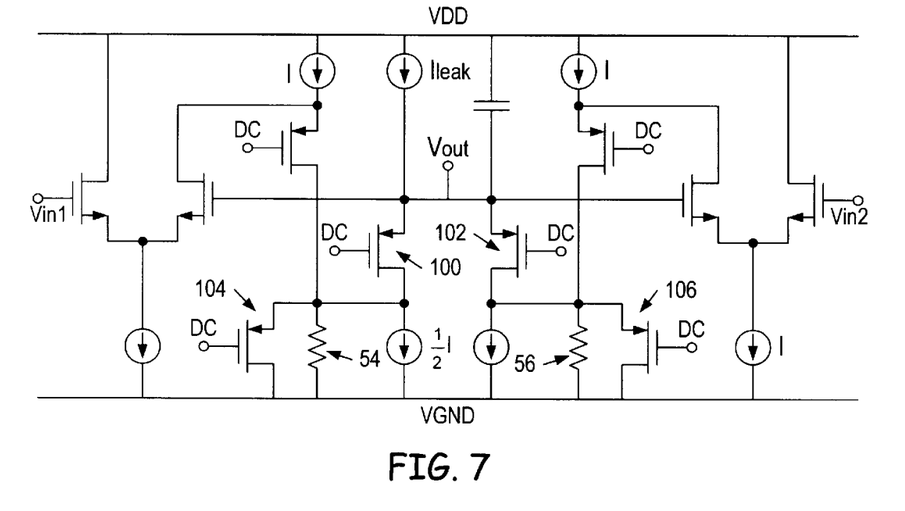
FIG. 7 is a schematic diagram of a peak detector circuit using features of FIG. 3 according to another embodiment of the invention employing n-channel transistors in lieu of diodes.

The peak-capturing devices/circuits (e.g., the diodes shown in FIG. 3) can be implemented using n-channel devices 100 and 102, as seen FIG. 7. The n-channel devices have their sources tied to load devices 54 and 56, as well as other devices shown. The gate conductors of transistors 100 and 102 are tied to a bias voltage (e.g., DC bias) and their drains are coupled to the output node. However, extra circuitry may be included to ensure the voltages at the source terminals of transistors 100 and 102 do not rise high enough to cause transistors 100 and 102 to operate such that current flows in a reverse direction to the output nodes. This extra circuitry may comprise one or more p-channel transistors 104 and 106, as shown in FIG. 7, connected in parallel to the loads 54 and 56. The circuit function of FIG. 7 can also be inverted to provide a positive peak detector of functions similar to that illustrated in FIG. 4.

Figure 8:
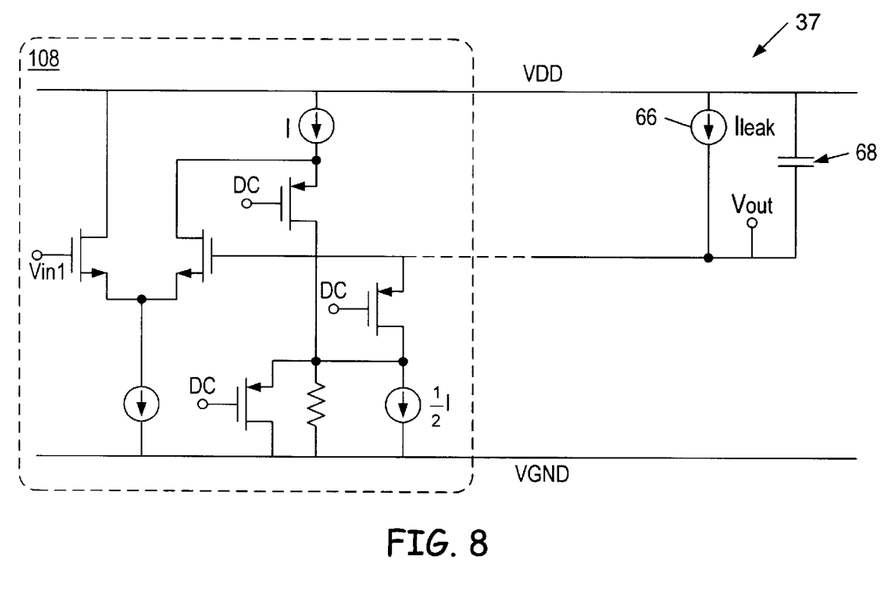
FIG. 8 is a schematic diagram of a peak detector circuit using features of FIGS. 3 and 5 according to a multiple-input embodiment of the invention.

The circuits and/or the features applicable to differentially connected transistor pairs can be implemented in multiple stages as shown in FIG. 8. Specifically, FIG. 8 illustrates a negative peak detector or, if inverted, a positive peak detector for detecting the most negative or most positive peak from among a plurality of input signals, and placing that peak upon an output node labeled Vout. Detector 37, shown in FIG. 8 illustrates one example of a modular peak detector. Modules 108 are repeated multiple times for a multiple input peak detector, shown in the example of FIG. 8 as a multiple input negative peak detector. Only one leakage device 66 need be used, in conjunction with a stabilizing capacitor 68.

Peak detector circuit 37 will effectively operate at levels up to the upper power supply $V_{DD}$. An inverted design for a positive peak detector is accomplished by reversing (or inverting) module 108, and components 66 and 68 relative to their coupling upon the upper and lower power supplies. An inverted, positive peak detector can effectively operate at input levels down to the lower power supply, or ground.

While the invention has been particularly shown and described with reference to preferred embodiments, it will be understood by those skilled in the art that various changes in form and detail may be made therein without departing from the spirit and scope of the invention.

What is claimed is:

1. A circuit, comprising:
    a first input transistor having a first input gate conductor and a first input conductive path, wherein one end of the first input conductive path is electrically connected to an upper power supply voltage, the other end of the first input conductive path is electrically coupled to a first current source, and the first input gate conductor is electrically coupled to a first input signal; and
    a first output transistor having a first output gate conductor and a first output conductive path, wherein the first output gate conductor is electrically coupled to an output signal, one end of the first output conductive path is electrically coupled to the first current source, and the other end of the first output conductive path is electrically coupled to a second current source, and wherein a voltage upon the first output gate conductor is brought down toward a voltage upon the first input gate conductor when a voltage less than that upon the first output gate conductor is applied to the first input gate conductor;
    wherein said circuit detects a negative peak voltage from among one or more input signals including the first input signal and produces the output signal, which follows a variation in the negative peak voltage with time.

2. The circuit as recited in claim 1, further comprising a first shunting transistor having a first shunting gate conductor and a first shunting conductive path, wherein the first shunting conductive path is electrically coupled between the second current source and a first load device, and the first shunting gate contact is electrically coupled to a first reference voltage, wherein said first reference voltage effectively maintains the first shunting transistor in a conducting state.

3. The circuit as recited in claim 2, further comprising:
    a first peak-capturing device electrically connected between the first output gate conductor and the first load device; and
    a third current source connected in parallel with the first load device.

4. The circuit as recited in claim 3, wherein the first peak-capturing device comprises a diode.

5. The circuit as recited in claim 3, wherein the first peak-capturing device comprises a transistor.

6. The circuit as recited in claim 1, further comprising:
    a leakage current source electrically connected between the upper power supply and the first output gate conductor; and
    a capacitor electrically connected in parallel with the leakage current source.

7. The circuit as recited in claim 1, further comprising:
    a second input transistor having a second input gate conductor and a second input conductive path, wherein one end of the second input conductive path is electrically connected to the upper power supply voltage, the other end of the second input conductive path is electrically coupled to a third current source, and the second input gate conductor is electrically coupled to a second input signal; and
    a second output transistor having a second output gate conductor and a second output conductive path, wherein the second output gate conductor is electrically coupled to the output signal, one end of the second output conductive path is electrically coupled to the third current source, and the other end of the second output conductive path is electrically coupled to a fourth current source, and wherein a voltage upon the second output gate conductor is brought down toward a voltage upon the second input gate conductor when a voltage less than that upon the second output gate conductor is applied to the second input gate conductor.

8. The circuit as recited in claim 2, wherein the first input transistor and the first output transistor comprise n-channel transistors, and the first shunting transistor comprises a p-channel transistor.

9. The circuit as recited in claim 2, wherein the first load device comprises a resistor.

10. The circuit as recited in claim 1, wherein the first and second current sources are adapted to produce an equal amount of current.

11. A circuit, comprising:
    a first input transistor having a first input gate conductor and a first input conductive path, wherein one end of the first input conductive path is electrically connected to a lower power supply voltage, the other end of the first input conductive path is electrically coupled to a first current source, and the first input gate conductor is electrically coupled to a first input signal; and
    a first output transistor having a first output gate conductor and a first output conductive path, wherein the first output gate conductor is electrically coupled to an output signal, one end of the first output conductive path is electrically coupled to the first current source, and the other end of the first output conductive path is electrically coupled to a second current source;
    wherein said circuit detects a positive peak voltage from among one or more input signals including the first input signal and produces the output signal, which follows a variation in the positive peak voltage with time.

12. The circuit as recited in claim 11, further comprising a first shunting transistor having a first shunting gate conductor and a first shunting conductive path, wherein the first shunting conductive path is electrically coupled between the second current source and a first load device, and the first shunting gate contact is electrically coupled to a first reference voltage, wherein said first reference voltage effectively maintains the first shunting transistor in a conductive state.

13. The circuit as recited in claim 12, further comprising:
    a first peak-capturing device electrically connected between the first output gate conductor and the first load device; and
    a third current source connected in parallel with the first load device.

14. The circuit as recited in claim 11, further comprising:
    a leakage current source electrically connected between the lower power supply and the first output gate conductor; and
    a capacitor electrically connected in parallel with the leakage current source.

15. The circuit as recited in claim 11, further comprising:
a second input transistor having a second input gate conductor and a second input conductive path, wherein one end of the second input conductive path is electrically connected to the lower power supply voltage, the other end of the second input conductive path is electrically coupled to a third current source, and the second input gate conductor is electrically coupled to a second input signal; and
a second output transistor having a second output gate conductor and a second output conductive path, wherein the second output gate conductor is electrically coupled to the output signal, one end of the second output conductive path is electrically coupled to the third current source, and the other end of the second output conductive path is electrically coupled to a fourth current source.

16. The circuit as recited in claim 12, wherein the first input transistor and the first output transistor comprise p-channel transistors, and the first shunting transistor comprises an n-channel transistor.

17. The circuit as recited in claim 11, wherein the first and second current sources are adapted to produce an equal amount of current.

18. The circuit as recited in claim 12, wherein the first load device comprises a resistor.

* * * * *